United States Patent
Vielemeyer et al.

(10) Patent No.: US 10,355,087 B2
(45) Date of Patent: Jul. 16, 2019

(54) SEMICONDUCTOR DEVICE INCLUDING A TRANSISTOR WITH A GATE DIELECTRIC HAVING A VARIABLE THICKNESS

(71) Applicant: Infineon Technologies AG, Neubiberg (DE)

(72) Inventors: Martin Vielemeyer, Villach (AT); Andreas Meiser, Sauerlach (DE); Till Schloesser, Munich (DE); Franz Hirler, Isen (DE); Martin Poelzl, Ossiach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/062,370

(22) Filed: Mar. 7, 2016

(65) Prior Publication Data

US 2016/0190256 A1 Jun. 30, 2016

Related U.S. Application Data

(63) Continuation of application No. 14/043,971, filed on Oct. 2, 2013, now Pat. No. 9,306,058.

(51) Int. Cl.
*H01L 29/10* (2006.01)
*H01L 29/78* (2006.01)
(Continued)

(52) U.S. Cl.
CPC ...... *H01L 29/1083* (2013.01); *H01L 21/2822* (2013.01); *H01L 29/1095* (2013.01);
(Continued)

(58) Field of Classification Search
CPC ........... H01L 29/41766; H01L 21/2822; H01L 29/407; H01L 29/4236; H01L 29/1083;
(Continued)

(56) References Cited

U.S. PATENT DOCUMENTS 5,828,101 A * 10/1998 Endo ............... H01L 27/088
257/330
6,353,252 B1 3/2002 Yasuhara et al.
(Continued)

FOREIGN PATENT DOCUMENTS

CN 101185169 A 5/2008
CN 101419981 A 4/2009
(Continued)

*Primary Examiner* — Marc Anthony Armand
*Assistant Examiner* — Sue Tang
(74) *Attorney, Agent, or Firm* — Murphy, Bilak & Homiller, PLLC

(57) ABSTRACT

A semiconductor device includes a transistor in a semiconductor substrate having a main surface. The transistor includes a source region, a drain region, a channel region, a drift zone, a gate electrode, and a gate dielectric adjacent to the gate electrode. The gate electrode is disposed adjacent to at least two sides of the channel region. The channel region and the drift zone are disposed along a first direction parallel to the main surface between the source region and the drain region. The gate dielectric has a thickness that varies at different positions of the gate electrode.

10 Claims, 20 Drawing Sheets

(51) Int. Cl.
  *H01L 29/66* (2006.01)
  *H01L 21/28* (2006.01)
  *H01L 29/40* (2006.01)
  *H01L 29/417* (2006.01)
  *H01L 29/423* (2006.01)
  *H01L 21/265* (2006.01)

(52) U.S. Cl.
  CPC ...... *H01L 29/407* (2013.01); *H01L 29/41766* (2013.01); *H01L 29/4236* (2013.01); *H01L 29/4238* (2013.01); *H01L 29/42368* (2013.01); *H01L 29/66681* (2013.01); *H01L 29/66696* (2013.01); *H01L 29/66704* (2013.01); *H01L 29/7816* (2013.01); *H01L 29/7825* (2013.01); H01L 21/26506 (2013.01); H01L 21/26586 (2013.01)

(58) Field of Classification Search
  CPC ............. H01L 29/7825; H01L 29/1095; H01L 29/42368; H01L 29/4238
  See application file for complete search history.

(56) References Cited

U.S. PATENT DOCUMENTS

| | | |
|---|---|---|
| 6,452,231 B1 | 9/2002 | Nakagawa et al. |
| 6,525,375 B1 | 2/2003 | Yamaguchi et al. |
| 6,589,845 B1 | 7/2003 | Nair et al. |
| 6,670,673 B2 | 12/2003 | Sakakibara |
| 6,696,323 B2 | 2/2004 | Yamaguchi et al. |
| 7,126,166 B2 | 10/2006 | Nair et al. |
| 7,132,333 B2 | 11/2006 | Schloesser et al. |
| 7,368,777 B2 | 5/2008 | Kocon |
| 7,423,325 B2 | 9/2008 | Tihanyi |
| 7,622,354 B2 | 11/2009 | Dreeskornfeld et al. |
| 7,635,893 B2 | 12/2009 | Weis et al. |
| 7,642,597 B2 | 1/2010 | Saito |
| 7,714,384 B2 | 5/2010 | Seliskar |
| 7,820,517 B2 | 10/2010 | Gammel et al. |
| 7,964,913 B2 | 6/2011 | Darwish |
| 8,115,253 B2 | 2/2012 | Tang et al. |
| 8,415,711 B2 | 4/2013 | Kitagawa et al. |
| 8,847,311 B2 | 9/2014 | Meiser et al. |
| 9,006,811 B2 | 4/2015 | Meiser et al. |
| 2001/0045599 A1* | 11/2001 | Hueting .............. H01L 29/4236 257/330 |
| 2002/0155685 A1 | 10/2002 | Sakakibara |
| 2003/0132463 A1 | 7/2003 | Miyoshi |
| 2005/0156234 A1 | 7/2005 | Gammel et al. |
| 2006/0006386 A1* | 1/2006 | Hirler .................. H01L 29/404 257/60 |
| 2006/0076621 A1 | 4/2006 | Hirler |
| 2006/0145230 A1 | 7/2006 | Omura et al. |
| 2006/0202272 A1 | 9/2006 | Wu et al. |
| 2006/0237781 A1* | 10/2006 | Marchant ............ H01L 29/7813 257/330 |
| 2007/0108469 A1 | 5/2007 | Nakano et al. |
| 2007/0221992 A1 | 9/2007 | Seliskar |
| 2008/0003703 A1 | 1/2008 | Gammel et al. |
| 2009/0020852 A1 | 1/2009 | Harada |
| 2009/0108343 A1 | 4/2009 | Nemtsev et al. |
| 2009/0114968 A1* | 5/2009 | Wang ................ H01L 21/26506 257/301 |
| 2009/0256212 A1 | 10/2009 | Denison et al. |
| 2009/0267116 A1 | 10/2009 | Wu et al. |
| 2009/0283825 A1 | 11/2009 | Wang et al. |
| 2010/0176421 A1 | 7/2010 | Van Hove et al. |
| 2010/0201439 A1* | 8/2010 | Wu ........................ H01L 23/492 327/581 |
| 2010/0327349 A1 | 12/2010 | Arie et al. |
| 2011/0018058 A1 | 1/2011 | Disney et al. |
| 2011/0169075 A1 | 7/2011 | Hsieh |
| 2012/0043638 A1 | 2/2012 | Kitagawa |
| 2012/0061753 A1 | 3/2012 | Nishiwaki |
| 2012/0074460 A1 | 3/2012 | Kitagawa |
| 2012/0199878 A1 | 8/2012 | Shrivastava et al. |
| 2012/0211834 A1 | 8/2012 | Yang et al. |
| 2013/0037853 A1 | 2/2013 | Onozawa |
| 2014/0084362 A1 | 3/2014 | Schloesser et al. |
| 2014/0151798 A1 | 6/2014 | Meiser et al. |
| 2015/0091088 A1 | 4/2015 | Vielemeyer et al. |

FOREIGN PATENT DOCUMENTS

| | | |
|---|---|---|
| CN | 102007584 A | 4/2011 |
| CN | 102157493 A | 8/2011 |
| DE | 19818300 C1 | 7/1999 |
| DE | 102004056772 B4 | 1/2007 |
| DE | 102007040066 A1 | 3/2008 |
| JP | 2001274398 A | 10/2001 |
| JP | 2012089826 A | 5/2012 |

* cited by examiner

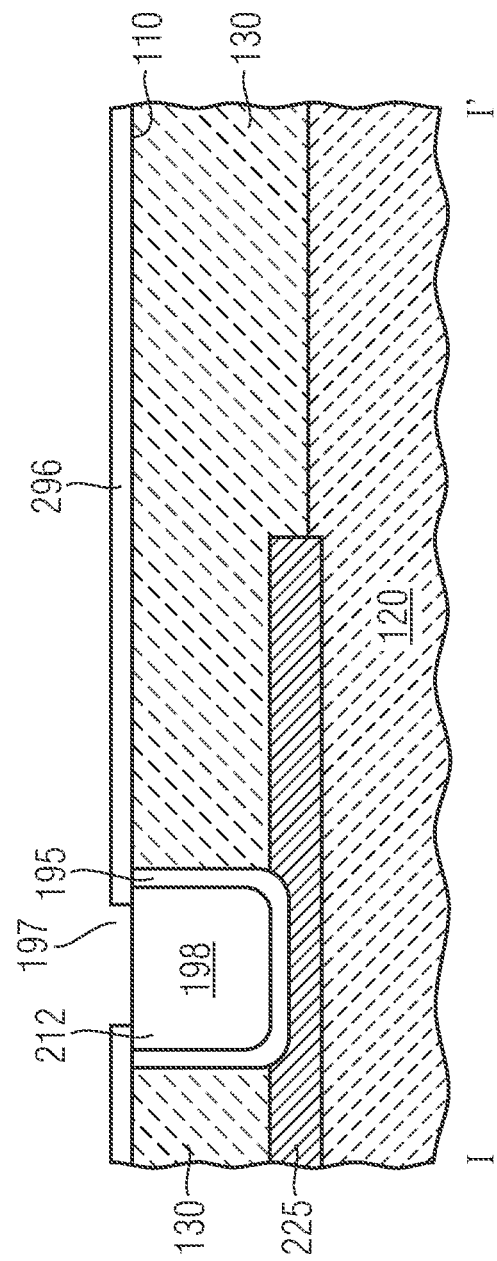

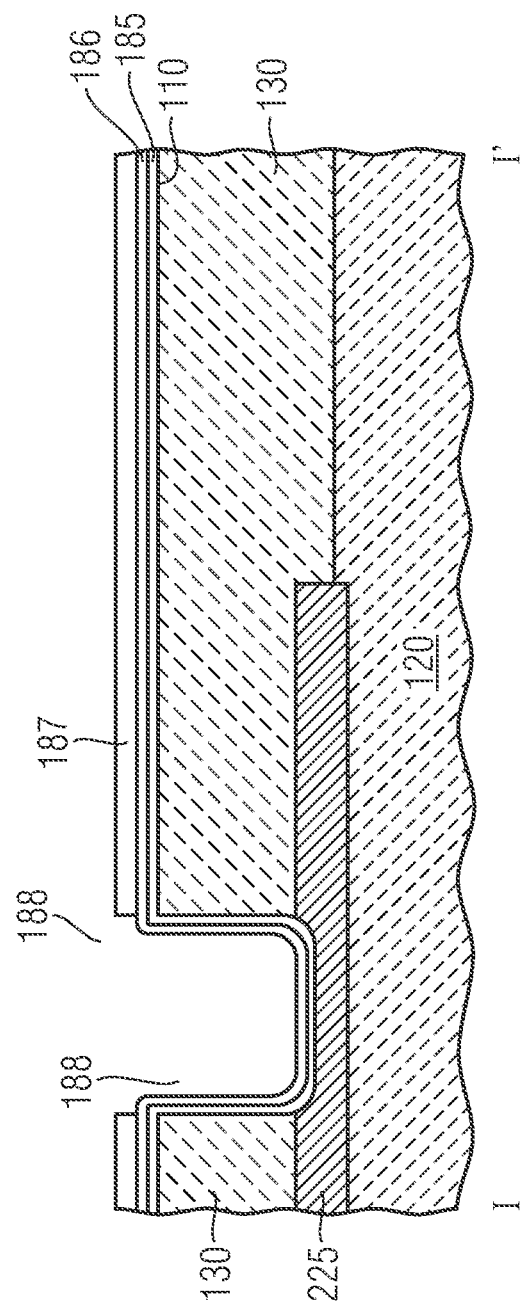

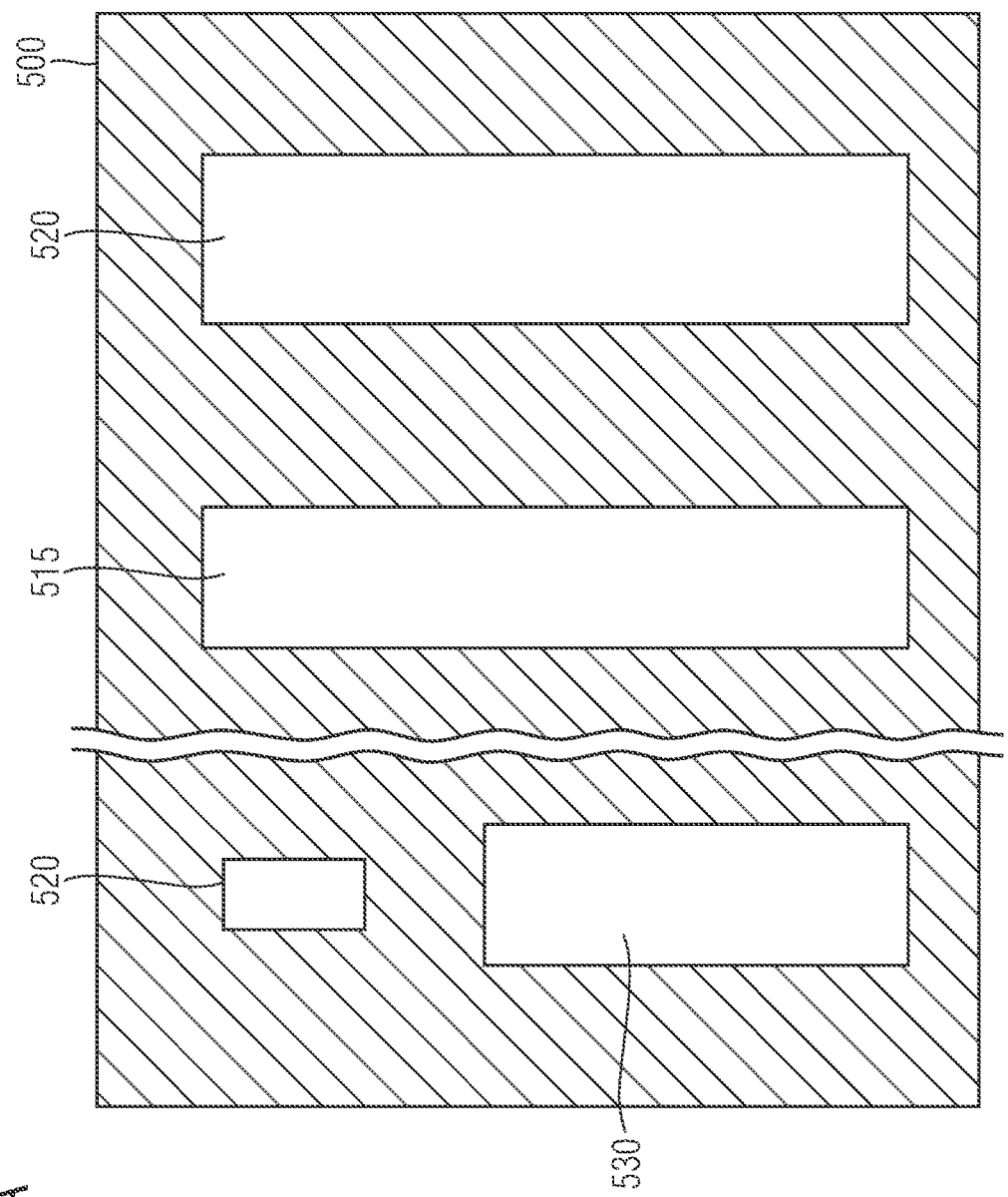

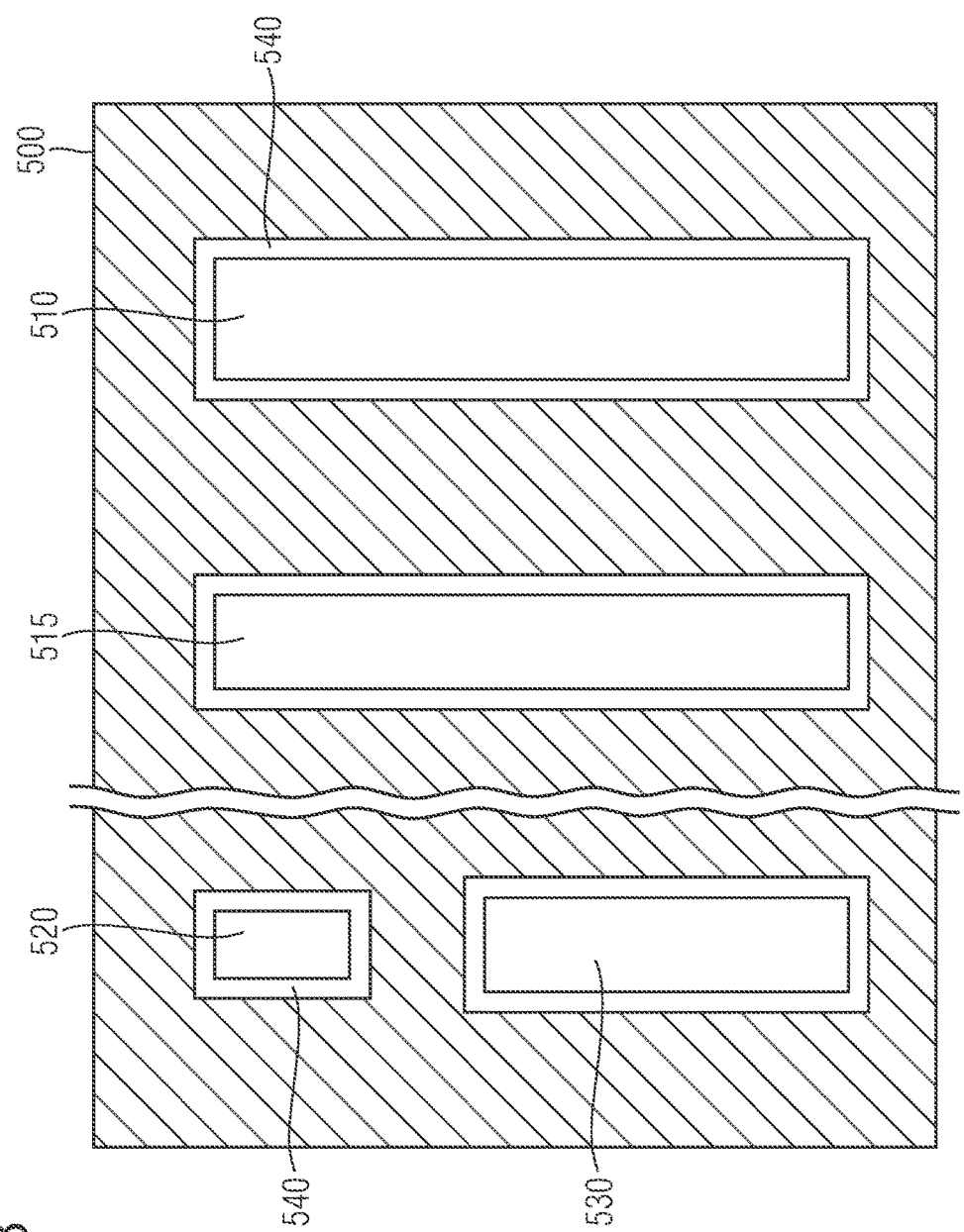

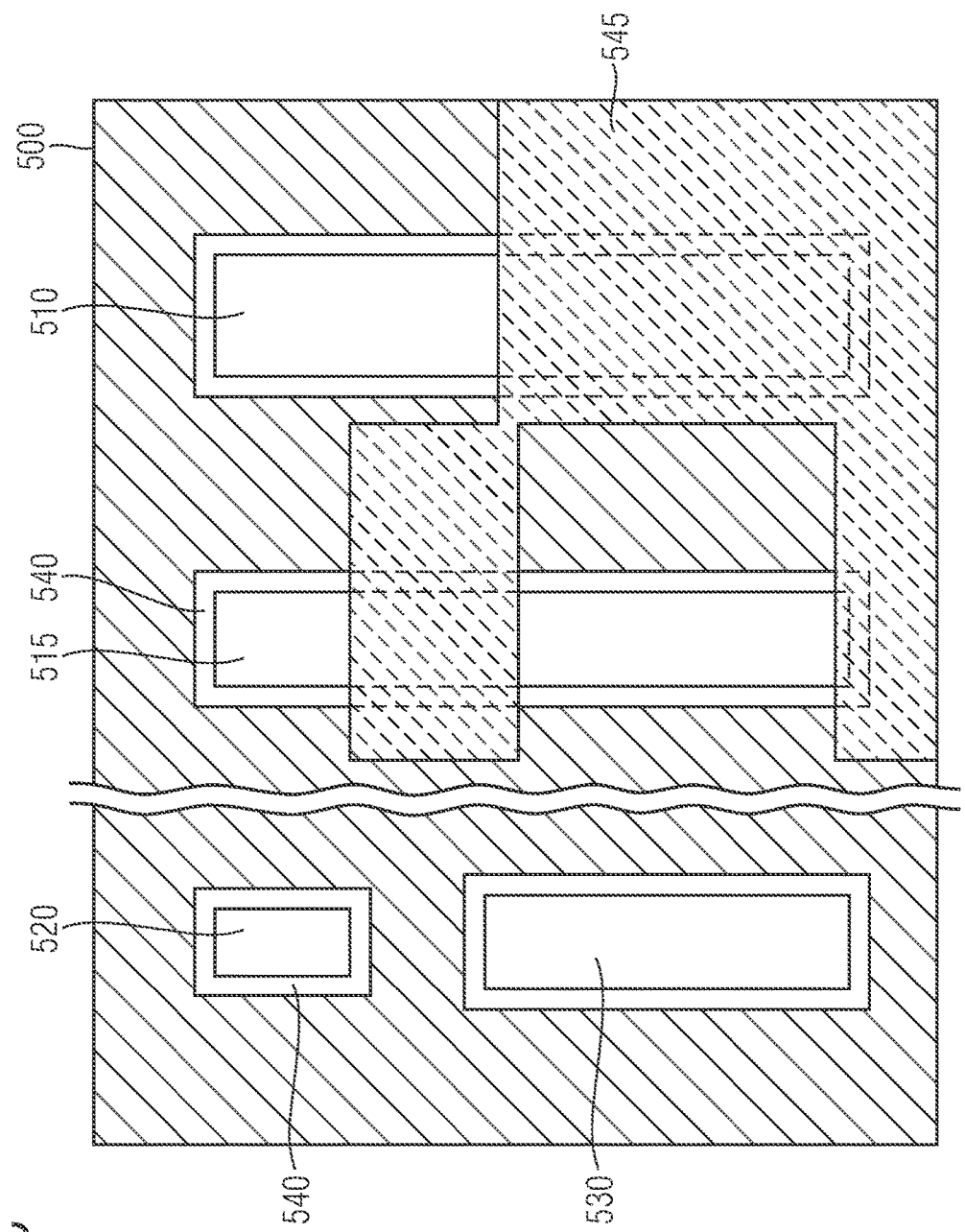

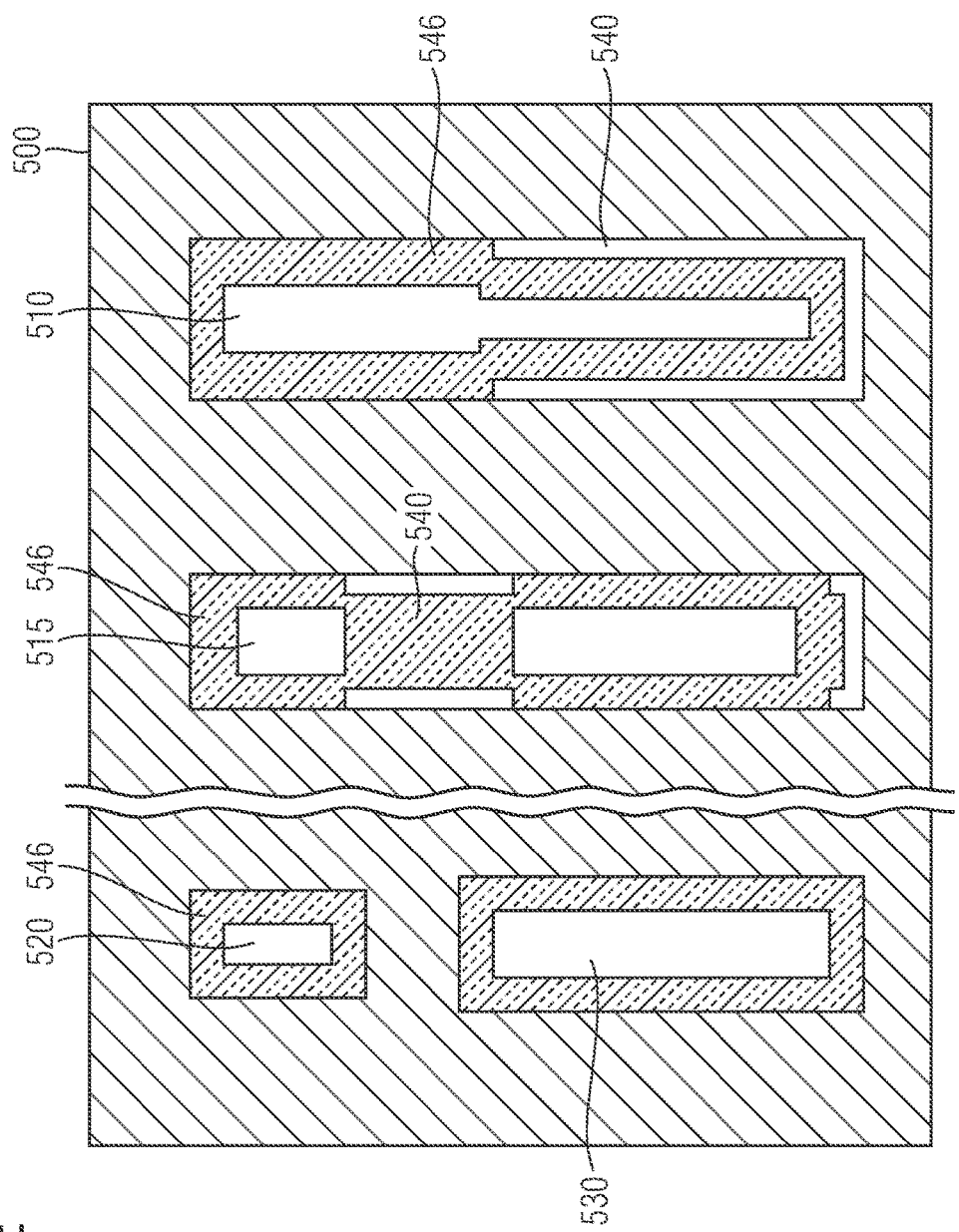

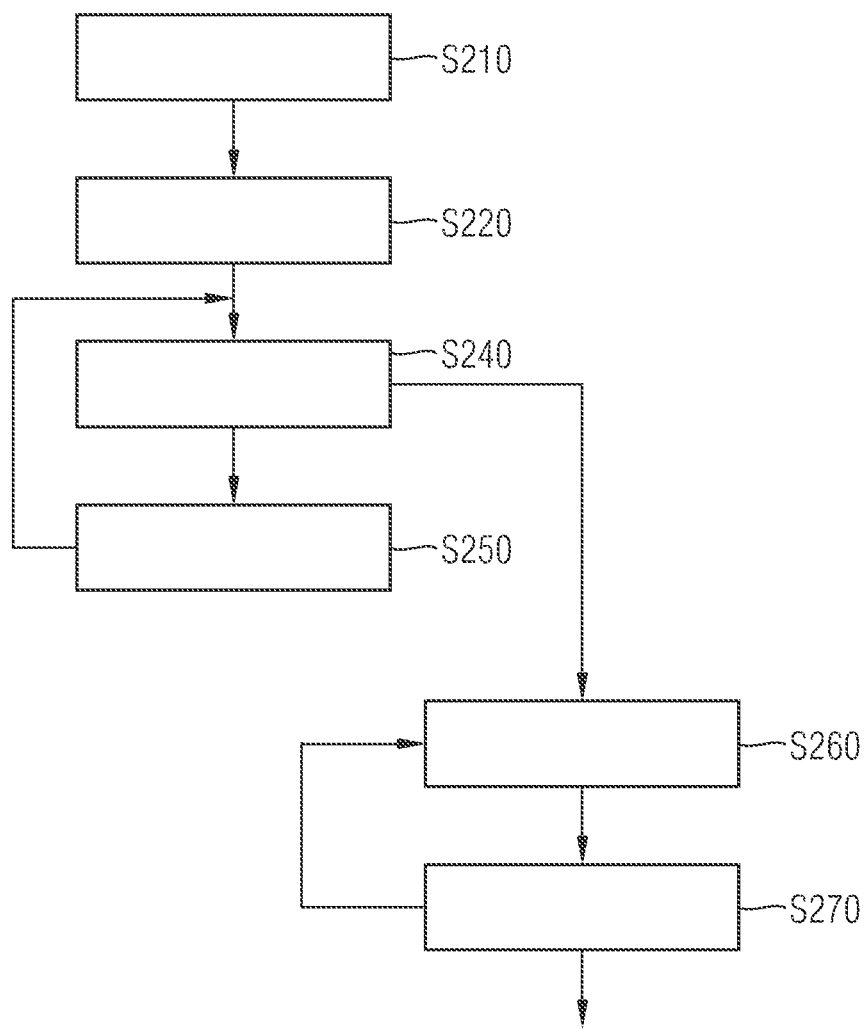

SEMICONDUCTOR DEVICE INCLUDING A TRANSISTOR WITH A GATE DIELECTRIC HAVING A VARIABLE THICKNESS

BACKGROUND

Power transistors commonly employed in automotive and industrial electronics require a low on-state resistance ($R_{on}$), while securing a high voltage blocking capability. For example, a MOS ("metal oxide semiconductor") power transistor should be capable, depending upon application requirements to block drain to source voltages $V_{ds}$ of some tens to some hundreds or thousands of volts. MOS power transistors typically conduct very large currents which may be up to some hundreds of Amperes at typical gate-source voltages of about 2 to 20 V.

Lateral power devices, in which current flow mainly takes place parallel to a main surface of a semiconductor substrate, are useful for integrated circuits in which further components, such as switches, bridges and control circuits are integrated.

For example, power transistors may be used in DC/DC or AC/DC converters in order to switch a current using an inductor. In these converters frequencies in a range from 100 kHz up to several MHz are employed. In order to reduce switching losses, attempts are being made to minimize capacitances in the power transistors. Thereby, switching operations may be accelerated.

SUMMARY

According to an embodiment, an integrated circuit comprises a transistor in a semiconductor substrate having a main surface. The transistor includes a source region, a drain region, a channel region, a drift zone, a gate electrode, and a gate dielectric adjacent to the gate electrode. The gate electrode is disposed adjacent to at least two sides of the channel region, the channel region and the drift zone are disposed along a first direction parallel to the main surface between the source region and the drain region. The gate dielectric has a thickness that varies at different positions of the gate electrode.

According to a further embodiment, an integrated circuit comprises a transistor in a semiconductor substrate having a main surface. The transistor includes a source region, a drain region, a channel region, a drift zone, a gate electrode, and a gate dielectric adjacent to the gate electrode. The gate electrode and the gate dielectric are disposed in gate trenches, the gate trenches being disposed adjacent to two sides of the channel region. The channel region and the drift zone are disposed along a first direction between the source region and the drain region, the first direction extending parallel to the main surface. The gate dielectric has a thickness that varies at different positions of the gate electrode.

According to an embodiment, a method of manufacturing a semiconductor device includes forming a transistor in a semiconductor substrate having a main surface. Forming the transistor comprises forming a source region, forming a drain region, forming a channel region, forming a drift zone, forming a gate electrode adjacent to the channel region, and forming a gate dielectric adjacent to the gate electrode. The gate electrode is disposed adjacent to at least two sides of the channel region, the channel region and the drift zone being disposed along the first direction parallel to the main surface between the source region and the drain region. The gate dielectric is formed so as to have a thickness that varies at different positions of the gate electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of this specification. The drawings illustrate the main embodiments and together with the description serve to explain the principles. Other embodiments and many of the intended advantages will be readily appreciated, as they become better understood by reference to the following detailed description. The elements of the drawings are not necessarily to scale relative to each other. Like reference numbers designate corresponding similar parts.

FIG. 4C shows a cross-sectional view of a semiconductor substrate when performing a method according to a further embodiment;

FIG. 4D shows a cross-sectional view of a semiconductor substrate when performing a method according to still a further embodiment;

FIGS. 5A to 5I illustrate views of a semiconductor substrate when performing a method according to a further embodiment;

FIG. 9 shows a flow diagram of a method according to still a further embodiment.

DETAILED DESCRIPTION

Figures 1A, 1B:
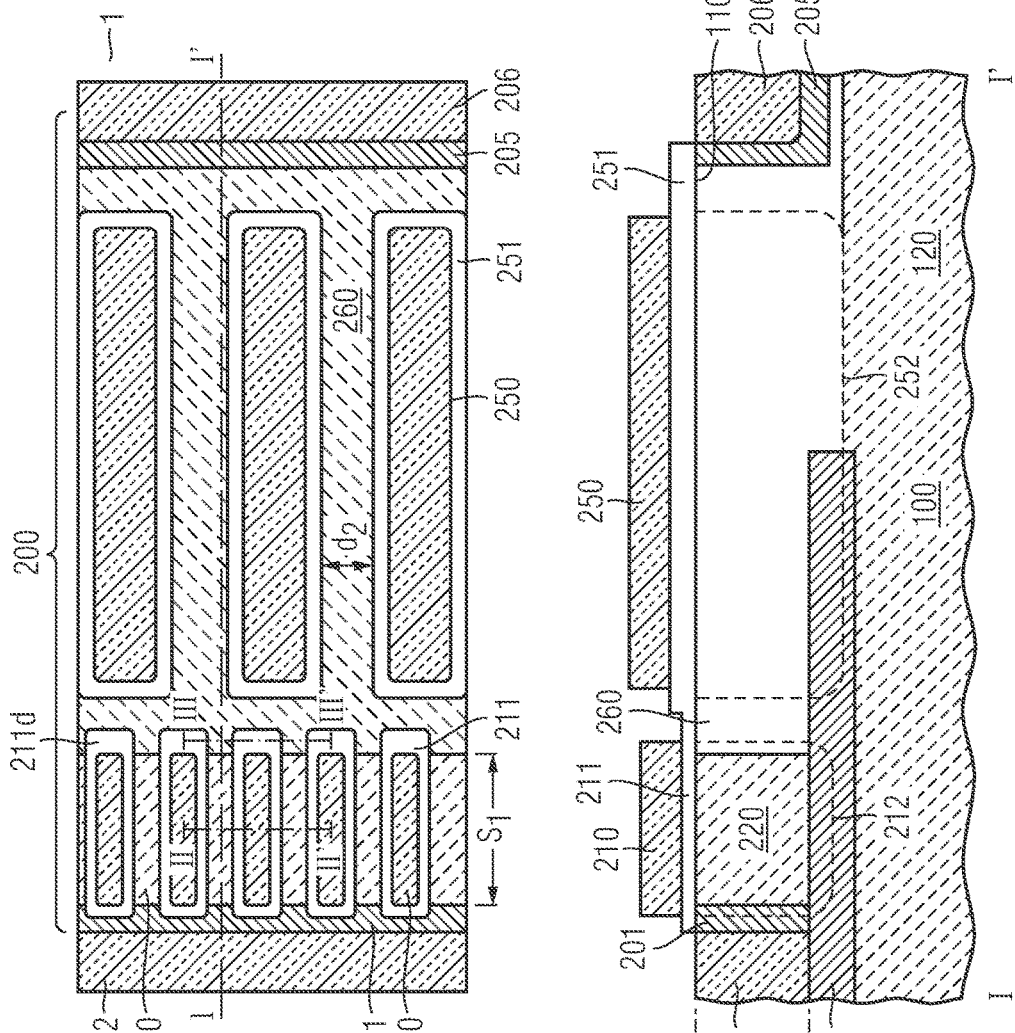
FIG. 1A shows a cross-sectional view of an integrated circuit taken in a plane parallel to a main surface of a semiconductor substrate according to an embodiment.
FIG. 1B shows a further cross-sectional view of the integrated circuit shown in FIG. 1A.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

FIG. 1A shows a cross-sectional view of an integrated circuit 1 which is taken in a plane parallel to a main surface of a semiconductor substrate. The integrated circuit 1 includes a transistor 200. The transistor 200 shown in FIG. 1A comprises a source region 201, a drain region 205, a channel region 220, and a drift zone 260. The source region 201, the drain region 205 and the drift zone 260 may be doped with dopants of a first conductivity type, for example n-type dopants. The doping concentration of the source and the drain regions 201, 205 may be higher than the doping concentration of the drift zone 260. The channel region 220 is arranged between the source region 201 and the drift zone 260. The channel region 220 is doped with dopants of a second conductivity type, for example with p-type dopants. The drift zone 260 may be arranged between the channel region 220 and the drain region 205. The source region 201, the channel region 220, the drift zone 260 and the drain region 205 are disposed along a first direction parallel to a main surface of the semiconductor substrate. The source region 201 is connected to the source electrode 202. The drain region 205 is connected to the drain electrode 206. The integrated circuit 1 further comprises a gate electrode 210. The gate electrode 210 is insulated from the channel region 220 by means of an insulating gate dielectric material 211 such as silicon oxide. According to an embodiment, the transistor may further comprise a field plate 250 which is arranged adjacent to the drift zone 260. The field plate 250 is insulated from the drift zone 260 by means of an insulating field dielectric layer 251 such as silicon oxide.

When a suitable voltage is applied to the gate electrode 210, an inversion layer is formed at the boundary between the channel region 220 and the insulating gate dielectric material 211. Accordingly, the transistor is in a conducting state from the source region 201 to the drain region 205 via the drift zone 260. The conductivity of the channel that is formed in the channel region 220 is controlled by the gate electrode. By controlling the conductivity of the channel formed in the channel region, the current flow from the source region 201 via the channel formed in the channel region 220 and the drift zone 260 to the drain region 205 may be controlled.

When the transistor is switched off, no conductive channel is formed at the boundary between the channel region 220 and the insulating gate dielectric material 211 so that no current flows. Further, an appropriate voltage may be applied to the field plate in an off-state. For example, the field plate 150 may be connected with a source terminal, which is also connected with a source electrode 202. In an off-state, the field plate 250 depletes charge carriers from the drift zone 260 so that the breakdown voltage characteristics of the semiconductor device 1 are improved. In a semiconductor device 1 comprising a field plate 250 the doping concentration of the drift zone 260 may be increased without deteriorating the breakdown voltage characteristics in comparison to a device without a field plate. Due to the higher doping concentration of the drift zone, the on-resistance $RDS_{on}$ is further decreased resulting in improved device characteristics.

As is further illustrated in FIG. 1A, the gate dielectric has a thickness that varies at different positions of the gate electrode. For example, on a side of the gate electrode 210 that is adjacent to the drain electrode 205, the gate dielectric 211 comprises a portion 211d having a larger thickness than a thickness of the layer adjacent to the channel region 220. As will be explained herein below, according to further embodiments, the gate dielectric layer 211 may have portions that are adjacent to the source region, these portions having a larger thickness than a portion of the gate dielectric layer 211 adjacent to the channel region. According to a further embodiment, the thickness of the gate dielectric layer measured from a bottom side of the gate electrode may be larger than the thickness of the field dielectric layer between the gate electrode and the channel region 220.

FIG. 1B illustrates a cross-sectional view of the integrated circuit 1 between I and I' along the first direction, as is also indicated in FIG. 1A. The cross-sectional view of FIG. 1B is taken so as to intersect the channel region 220 and the drift zone 260. As is indicated by dotted lines, gate trenches 212 are disposed adjacent to the channel region 220 in a plane before and behind the depicted plane of the drawing. Further, as is indicated by dotted lines, field plate trenches 252 may be disposed adjacent to the drift zone 260 in a plane before and behind the depicted plane of the drawing. The gate trench 212 and the field plate trench 252 extend from the main surface 110 in a depth direction of the substrate 100. As a consequence, the gate electrode is adjacent to at least two sides of the channel region 220. Further, the channel region 220 has the shape of a first ridge. Due to the presence of the field plate trenches 252, according to an embodiment, the drift zone 260 may have the shape of a second ridge. The source region 201 extends from the main surface 110 into a depth direction of the substrate 100, i.e. perpendicularly with respect to the main surface 110. The drain region 205 likewise extends from the main surface 110 in a depth direction of the substrate 100. FIG. 1B further shows a body connect implantation region 225 that is disposed beneath the body region 220 and beneath a part of the drift zone 260. The body connect implantation portion 225 connects the channel region to the source contact so as to avoid a parasitic bipolar transistor which could be otherwise formed at this portion. Moreover, the body connect implantation portion 225 extends beneath the drift zone 260 so that in an off-state of the transistor, the drift zone 260 may be depleted more easily. The body connect implantation portion 225 may be doped with dopants of the second conductivity type at a higher concentration than the channel region.

Figure 1C:
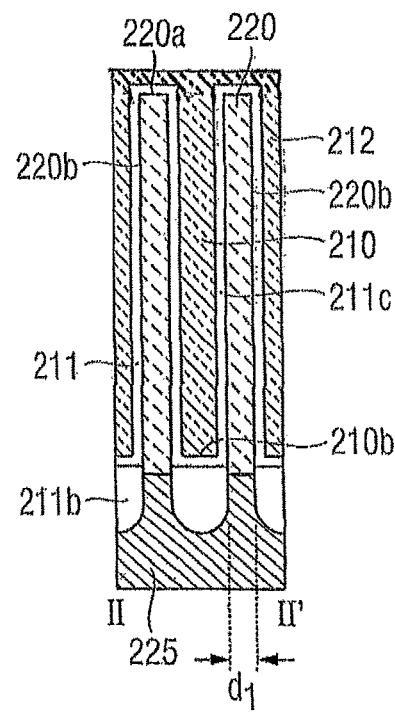
FIGS. 1C and 1D show cross-sectional views of elements of the integrated circuit illustrated in FIGS. 1A and 1B.

FIG. 1C illustrates a cross-sectional view of the integrated circuit which is taken between II and II' as is also illustrated in FIG. 1A. The direction between II and II' is perpendicular to the first direction. As is shown in FIG. 1C, the channel region 220 has the shape of a ridge, the ridge having a width d1. For example, the ridge may have a top side 220a and two sidewalls 220b. The sidewalls 220b may extend perpendicularly or at an angle of more than 75° with respect to the main surface 110. The gate electrode 210 may be disposed adjacent to at least two sides of the ridge. The gate dielectric 211 includes a portion 211c adjacent to the channel region 220. The gate dielectric layer 211c may have a thickness measured from the bottom side 210b of the gate electrode 210 perpendicularly with respect to the main surface 110 of the semiconductor substrate, the thickness being larger than at a portion adjacent to the channel region 211c. The width of the several gate trenches 212 may be different from each other.

Figure 1D:
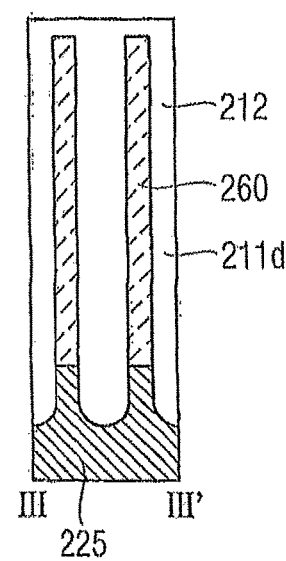

FIG. 1D shows a cross-sectional view of the gate trenches 212 between III and III' as is also illustrated in FIG. 1A. The cross-sectional view of FIG. 1D is taken at a portion of the thicker gate dielectric layer 211d is adjacent to the drain side. The deep body connect implant portion 225 is disposed beneath each of the ridges.

According to an embodiment, the width d1 of the channel region 220 fulfills the following relationship: $d1 \leq 2 \times l_d$, wherein $l_d$ denotes a length of a depletion zone which is formed at the interface between the gate dielectric layer 211 and the channel region 220. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material ($11.9 \times \varepsilon_0$ for silicon, $\varepsilon_0 = 8.85 \times 10^{-14}$ F/cm), k denotes the Boltzmann constant ($1.38066 \times 10^{-23}$ J/k), T denotes the temperature, ln denotes the natural logarithm, $N_A$ denotes the impurity concentration of the semiconductor body, $n_i$ denotes the intrinsic carrier concentration ($1.45 \times 10^{10}$ cm$^{-3}$ for silicon at 27° C.), and q denotes the elementary charge ($1.6 \times 10^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 20 to 130 nm, for example, 40 to 120 nm along the main surface 110 of the semiconductor substrate 100.

Moreover, the ratio of length to width may fulfill the following relationship: $s_1/d_1 > 2.0$, wherein s1 denotes the length of the first ridge in contact with the gate electrode 210, or, differently stated, the length of the channel region, measured along the first direction, as is also illustrated in FIG. 1. According to further embodiments, $s_1/d_1 > 2.5$.

According to the embodiment in which the width $d1 \leq 2 \times l_d$, the transistor 200 is a so-called "fully-depleted" transistor in which the channel region 220 is fully depleted when the gate electrode 210 is set to an on-voltage. In such a transistor, an optimal sub-threshold voltage may be achieved and short channel effects may be efficiently suppressed, resulting in improved device characteristics.

According to an embodiment, the drift zone 260 may comprise a flat surface which is not patterned to form ridges. According to a further embodiment, the field plate 250 may be arranged in trenches 252 so that the drift zone 260 comprises ridges. In a transistor including a field plate 250, it is desirable to use a drift zone 260 having a width d2 which is much larger than the width d1 of the channel region. Hence, the field plate trenches 252 may be disposed at a larger distance so that the portions of the drift zone 260 which are disposed between adjacent field plate trenches 252, have a larger width.

Due to the larger width of the drift zone d2, the resistance $RDS_{on}$ of the drift zone 260 may be further decreased, resulting in further improved device characteristics. In order to improve the characteristics of the semiconductor device in the body region and to further improve the device characteristics in the drift zone, patterning the gate electrode and the field plate may be accomplished using an appropriate etching mask so as to provide a different width of the first and second ridges.

As will be further explained herein below, this may be accomplished by forming a set of gate trenches 212 having a smaller pitch and by forming a set of field plate trenches 252 having a larger pitch. According to an embodiment, the gate trenches 212 and the field plate trenches 252 may be separate from each other. According to a further embodiment, the gate trenches 212 and the field plate trenches 252 may be merged so as to form one single trench having different width.

The integrated circuits illustrated in FIGS. 1A to 1D implement lateral power transistors. They may be employed in DC/DC or AC/DC converters since they may be integrated in an easy manner. Further, they may achieve high current densities so that they may be employed for small power and voltages between 10V and several hundred Volts. As will be explained in more detail herein below, the gate dielectric has a thickness that varies at different positions of the gate electrode 210.

Figure 2:
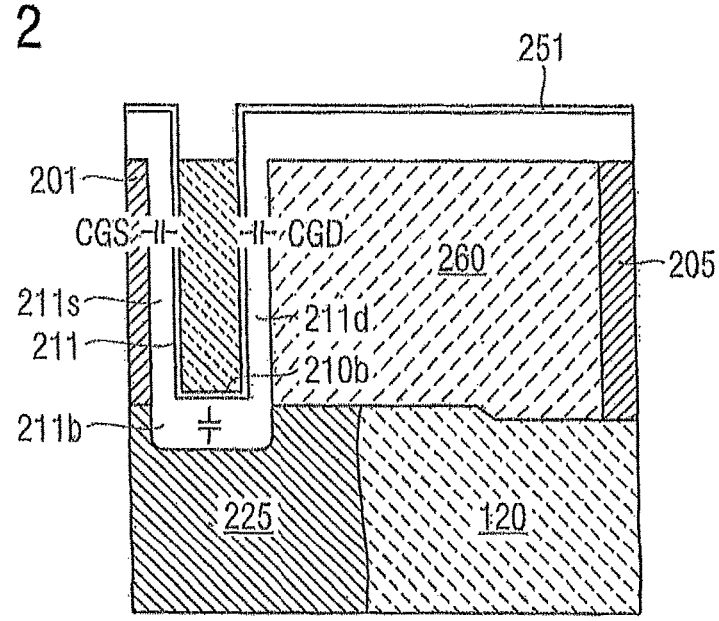
FIG. 2 shows components of the integrated circuit illustrated in FIG. 1.

FIG. 2 illustrates a cross-sectional view of the gate electrode between the source region 201 and the drift zone 260. When varying potentials are applied to the gate electrode 210, the gate drain capacitance $C_{gd}$ may be reduced in order to avoid switching losses. The gate-drain capacitance may be increased by locally increasing the thickness of the gate dielectric layer 211 at the portion facing the drain portion 205. Further, the gate-source capacitance may be decreased by increasing the thickness of the gate dielectric layer 211 at a portion between the source region 201 and the gate electrode 210. Further, the gate body capacitance $C_{gb}$ may be decreased by increasing the thickness of the dielectric layer 211 at the bottom portion 211b of the gate electrode. For example, the thickness of the portion 211d of the gate dielectric may be increased. In addition or alternatively, the thickness of the portion 211s of the gate dielectric layer facing the source region 201 may be increased. In addition or alternatively, the thickness of the bottom portion 211b of the gate dielectric layer between the bottom side of the gate electrode 210 and the adjacent semiconductor material may be increased.

According to a further embodiment, only the thickness of the portion 211d of the gate dielectric layer facing the drain region 205 may be increased while the thickness of the portion 211s of the gate dielectric layer 211 facing the source region 201 is maintained at a lower value corresponding to the thickness of the portion 211c of the gate dielectric layer 211 facing the channel region. Thereby the ratio of $C_{gd}/C_{gs}$ is decreased whereby drain-induced switching of the transistor may be avoided.

According to still a further embodiment, the thickness of the field dielectric layer 251 illustrated in FIG. 1A may also vary at different positions of the field electrode.

FIGS. 3A to 3D show cross-sectional views of the gate trenches 212 in a plane that is parallel to the main surface of the semiconductor substrate. As is shown, for example, in FIG. 3A, the gate dielectric layer 211 comprises a portion 211c adjacent to the channel region (not shown). The gate dielectric 211 further comprises a portion 211d adjacent to the drain region (not shown). Further, the gate dielectric 211 comprises a portion 211s adjacent to the source region (not shown). The thickness of the portion 211d is greater than the thickness of the portion 211c. Further, the thickness of the portion 211s may be greater than the thickness of the portion 211c. In the embodiment shown in FIG. 3A, the portions 211d and 211s are implemented by parts of an insulating filling.

Figure 3A:
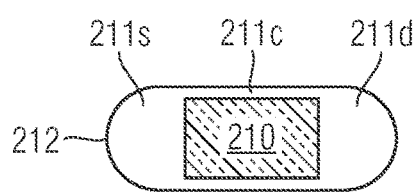
FIGS. 3A to 3D show cross-sectional views of a gate trench of the integrated circuit illustrated in FIGS. 1A to 1D.
Figure 3B:
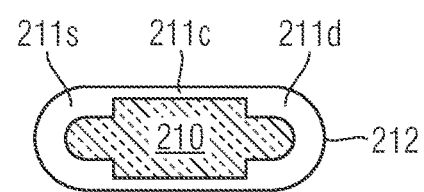

According to the embodiment of FIG. 3B, the portions 211d and 211s are implemented by a layer lining the sidewalls of the gate trench 212. The layer lining the sidewall of the gate trench 212 has different thicknesses so as to implement the portion 211c and the portions 211d and 211s.

Figure 3C:
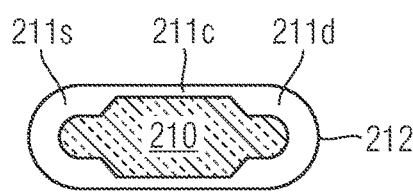

According to the embodiment of FIG. 3C, using appropriate deposition methods, a smooth transition from the portion adjacent to the source region or the drain region to the portion adjacent to the channel region may be implemented.

Figure 3D:
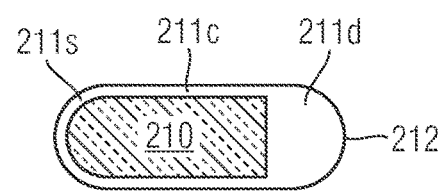

FIG. 3D shows an embodiment, according to which the gate dielectric layer 211 comprises a portion 211c adjacent to the channel region (not shown). The gate dielectric further comprises a portion 211d adjacent to the drain region (not shown). The gate dielectric comprises a portion 211s adjacent to the source region (not shown). The thickness of the portion 211d is greater than the thickness of the portions 211c and 211s. The thickness of the portions 211s and 211c may be approximately equal to each other. In this embodiment, the portions 211d may be implemented by a part of an insulating filling, and the portion 211s and 211c may be implemented by a conformal layer.

Methods of forming a gate dielectric layer having different thicknesses will be illustrated with reference to FIGS. 4A to 9.

Figure 4A:
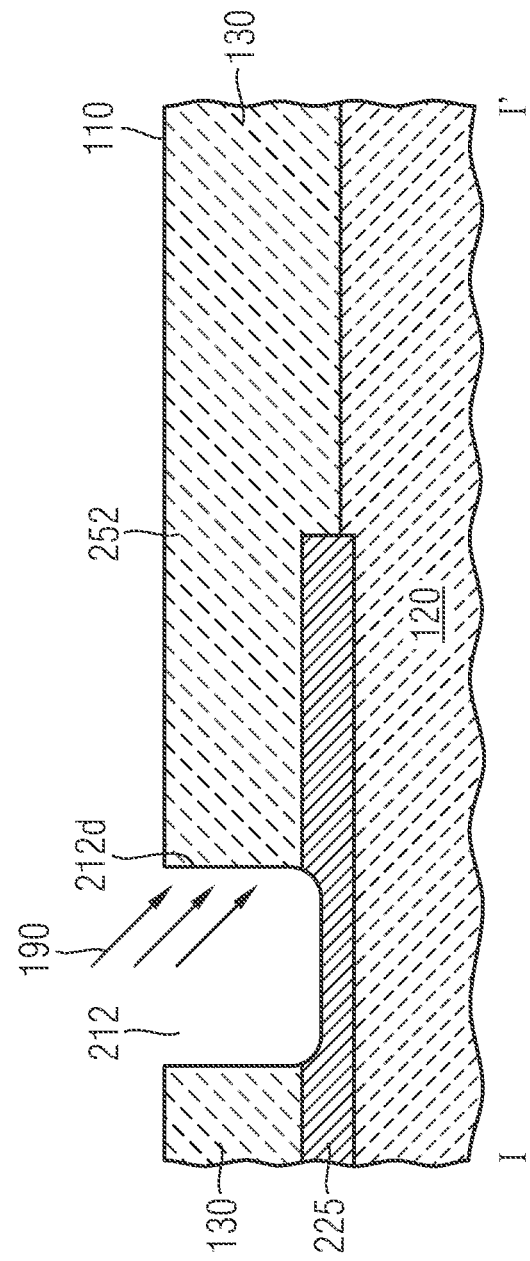
FIG. 4A shows a cross-sectional view of a semiconductor substrate when performing a method according to an embodiment.

FIG. 4A illustrates elements of a workpiece including the integrated circuit during a manufacturing process. The cross-sectional view of FIG. 4A is taken between I and I' as is also illustrated in FIG. 1A. The work piece illustrated in FIG. 4A comprises a doped well portion 120 of the second conductivity type, and a further doped region 130 disposed over the doped well portion 120. The further doped region 130 may be doped with the first conductivity type. A body connect portion 225 is disposed between the doped well portion 120 and a portion of the region 130. The body connect portion 225 may be doped with the second conductivity type at a higher doping concentration than the well portion 120. A gate trench 212 is formed in the main surface 110 of the semiconductor substrate. As is illustrated, a tilted ion implantation 190 may be performed so as to implant different materials which may increase or decrease the growth rate of silicon oxide when performing a thermal oxidation step. For example, the portions of the trench sidewall 212d that are adjacent to the side of the drain region and, optionally, the portions of the trench 212 that are adjacent to a side of the source region may be implanted with fluorine which will increase the growth rate of thermally grown silicon oxide. Further optionally, the bottom side of the trench 212 may be implanted with fluorine. Further, for example nitrogen may be implanted in a direction that is perpendicular with respect to the depicted plane of the drawing. Thereby, the portions of the sidewalls of the gate trench 212 adjacent to the channel region may be doped. Doping with nitrogen reduces the growth rate of silicon oxide. Thereafter, a thermal oxidation step may be performed at a temperature of more than 800° C. Due to the implantation with different materials, the gate dielectric material will grow with different growth rates resulting in different thicknesses of the oxide layer.

Figure 4B:
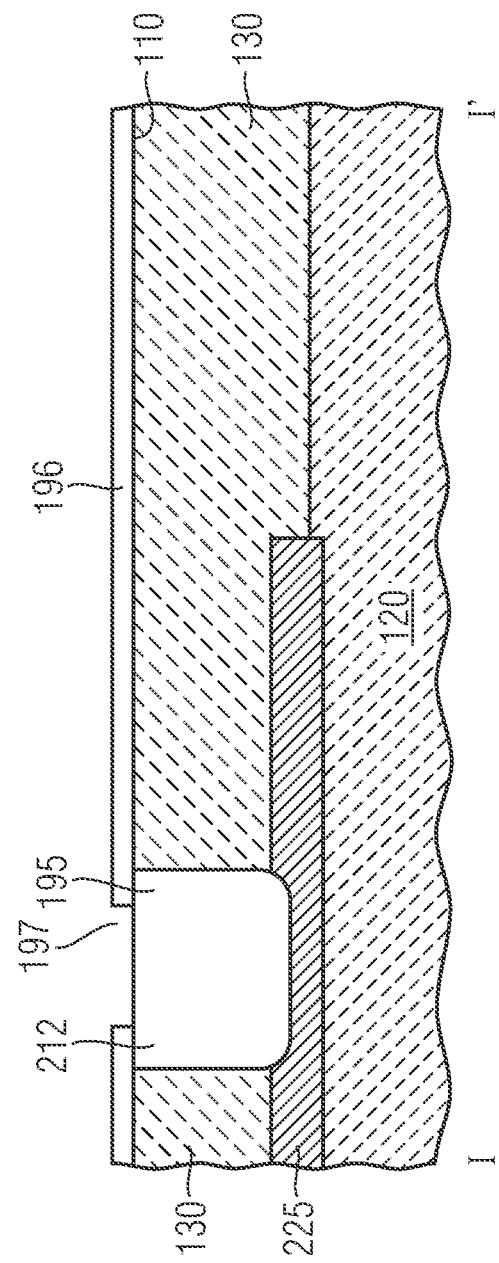
FIG. 4B shows a cross-sectional view of the semiconductor substrate when performing a method according to a further embodiment.

FIG. 4B shows a further embodiment of forming a gate dielectric layer having varying thicknesses. Starting from a structure similar to that shown in FIG. 4A without the tilted ion implantation, a dielectric layer 195 such as silicon dioxide may be filled in the gate trench 212 and may be covered by a photoresist layer 196. Resist openings 197 may be defined in the photoresist layer 196. For example, the opening 197 may be formed in a stripe-like manner which leaves the central portion of the gate trench 212 completely open so that the photoresist layer 196 covers the end portions of the gate trench 212. Thereafter, an anisotropic etching step may be performed. By this etching step the silicon oxide layer 195 may be removed down to the bottom portion of the gate trench 212 or to a predetermined height. For example, this etching step may be time-controlled so that a predetermined portion of the dielectric layer 195 remains in the bottom portion of the gate trench 212. Thereafter, the remaining portions of the photoresist layer are removed, followed by a step of forming a gate dielectric layer having a smaller thickness than the portions at the end sides of the gate trench 212. By this processing steps, for example, the structure illustrated in FIG. 3A may be obtained. When a portion of the dielectric layer 195 remains in the trench, the thickness of the gate dielectric 211 measured from the bottom side of the gate electrode 210 may be increased.

FIG. 4C shows a further embodiment of a method of manufacturing an integrated circuit. Starting from a structure similar to that shown in FIG. 4A without the tilted ion implantation step, a thick dielectric layer 195 such as silicon oxide is formed so as to line the sidewalls of the gate trench 212. Thereafter, a sacrificial layer 198 which may comprise a material that may be etched selectively with respect to the dielectric layer 195 is filled into the gate trench 212. A photoresist layer 196 is formed over the main surface 110 of the semiconductor substrate and openings 197 are photolithographically defined. For example, the opening 197 may have a stripe-like shape extending perpendicularly with respect to the depicted plane of the drawing. According to an embodiment, starting from the structure shown in FIG. 4C, an anisotropic etching step may be performed so as to etch the uncovered portions of the dielectric layer 195 which are disposed behind and before the depicted plane of the drawing. After removing the remaining portions of the sacrificial layer 198 and the photoresist layer 196, an oxidation step may be performed so as to form the portion of the gate dielectric layer that is adjacent to the channel region.

According to a further embodiment, starting from the structure shown in FIG. 4C, the sacrificial layer 198 may be etched anisotropically. For example, this etching step may be performed to reach the bottom portion of the dielectric layer 195 or down to a predetermined height. Thereafter, an isotropic etching step may be performed so as to etch the portions of the gate dielectric layer 195 that are disposed adjacent to the channel region. During this etching step, the dielectric layer at the right-hand side wall and the left-hand side wall of the gate trench 212 illustrated in FIG. 4C is protected by the remaining portion of the sacrificial layer 198. Further, the photoresist mask 196 protects the layer 195 at the upper surface thereof. After this isotropic etching step, the remaining portions of the photoresist layer 196 may be removed and, optionally, the remaining portions of the sacrificial layer 198. Thereafter, a further oxidation step may be performed so as to form the portion of the gate dielectric layer that is adjacent to the channel region.

FIG. 4D illustrates a further embodiment of a method of forming the gate dielectric layer having a varying thickness. Starting from the structure that is shown in FIG. 4A without the ion implantation 190, a thin pad oxide layer 185 may be formed over the surface of the semiconductor substrate, followed by a thin silicon nitride layer having a thickness of approximately 20 nm as is common. As is clearly to be understood, this layer stack may also comprise further layers such as a thin polysilicon layer between the pad oxide and the nitride layer. Nevertheless, the topmost layer 186 of this layer stack should comprise silicon nitride. A photoresist layer 187 is formed over this layer stack and patterned to form resist openings 188. An example of a resulting structure is shown in FIG. 4D. Thereafter, etching steps are performed so as to remove the layer stack from the resist openings 188. After removing the remaining portions of the photoresist layer 187, portions of the semiconductor substrate are covered by a layer stack including the silicon nitride layer 185, whereas other portions of the silicon substrate include exposed silicon portions. Thereafter, a thermal oxidation step is performed so as to grow a silicon oxide layer on the exposed portions of the silicon substrate. In a next step, the silicon nitride layer 186 and the pad oxide layer 185 are removed. Then, a thermal oxidation step is performed so as to form the silicon oxide layer at those portions having the reduced thickness. Employing this method, for example, a structure as illustrated in FIG. 3C may be formed.

According to a further embodiment, the channel region and the portion of the gate dielectric adjacent to the channel region (i.e. the gate dielectric having the smaller thickness) may be formed in a self-aligned manner. Forming these portions in a self-aligned manner is intended to mean that the method of forming the channel region and forming the portion of the gate dielectric are formed by processes that may be influenced by the same constraints or processing conditions. As a result, the channel region may be present only at portions at which the gate dielectric having the smaller thickness is present, and the gate dielectric having the smaller thickness is present only at portions at which the channel region is adjacent. As a result, fluctuations of the gate-drain capacitances can be avoided while at the same time achieving desired transistor characteristics by reducing an overlap between gate electrode and adjacent drift zone. For example, the channel region and the portion of the gate dielectric having the smaller thickness may be formed in a self-aligned manner using one common mask for etching the gate dielectric in the gate trench and for performing the body/channel implant that defines the position of the drain junction or the junction to the drift zone. For example, etching the gate dielectric may be performed by correspondingly adapting any of the processes described above with reference to FIGS. 4A to 4D, to provide the gate dielectric having the varying thickness. As a result, the drain junction and the portion of the gate dielectric having the smaller thickness may be formed without fluctuations due to different lithographic processes.

Figure 4E:
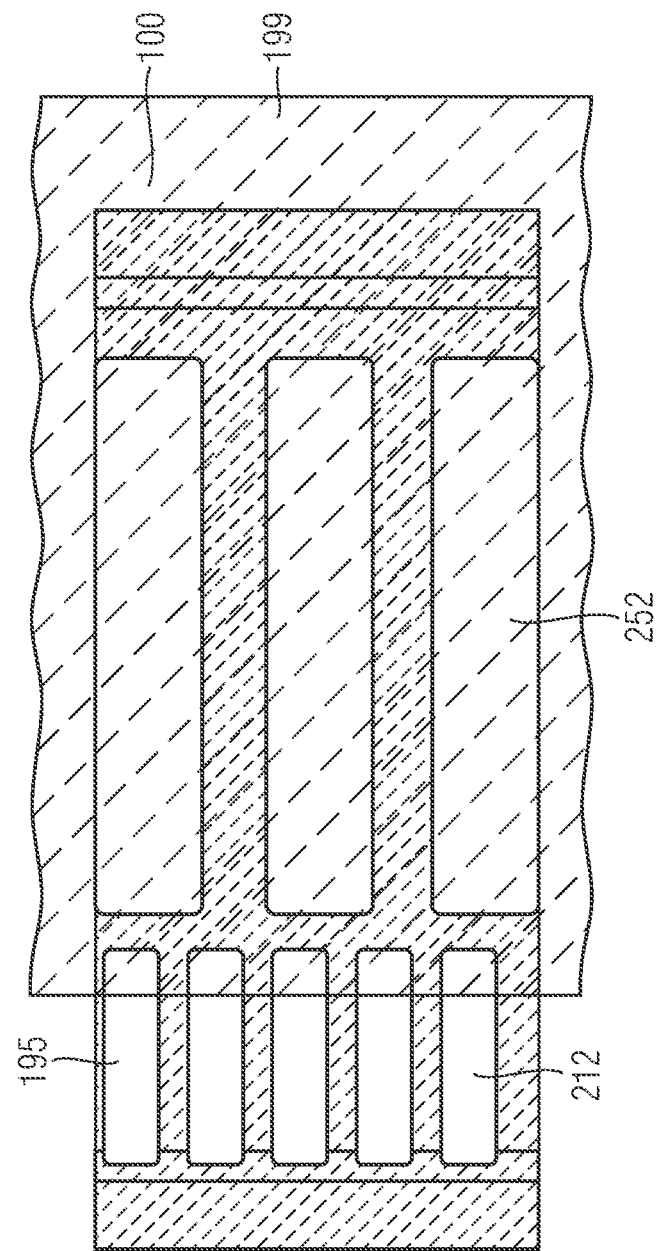
FIG. 4E shows a plan view of a semiconductor substrate when performing a method according to a further embodiment.

FIG. 4E shows an example of a substrate 100 when forming the channel region and the portion of the gate dielectric adjacent to the channel region in a self-aligned manner using a common mask. Gate trenches 212 and field plate trenches 252 are formed in the surface of a semiconductor substrate 100. The gate trenches 212 may be filled with a dielectric material 195. Using the mask 199, that may be made of a suitable hard mask material, a process of forming the channel region may be performed. Further, using the mask 199, the insulating material 195 may be removed from the gate trenches 212, followed by forming a thin gate dielectric layer that is adjacent to the channel region and, optionally, to the source region. These processes may be performed in a similar manner as has been described above with reference to FIG. 4B. As is clearly to be understood, any of the other processes feasible for forming a gate dielectric layer having a varying thickness may be correspondingly adapted.

Figure 5D:
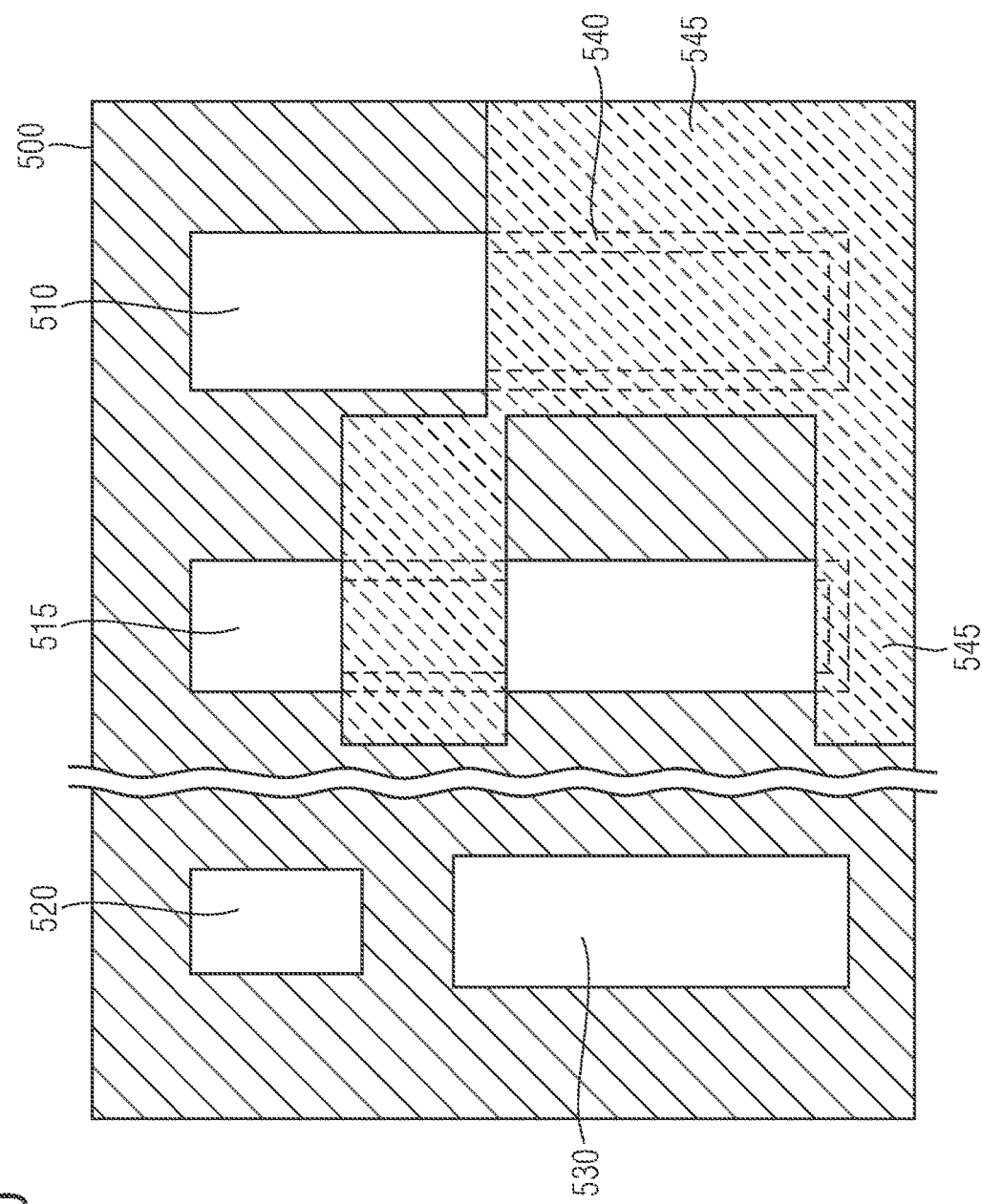

FIGS. 5A to 5I illustrate a further method of manufacturing an integrated circuit according to an embodiment. The embodiment of FIGS. 5A to 5I illustrate an embodiment according to which a specific dielectric layer is formed, followed by a patterning step, followed by a step of forming a further dielectric layer and further repeating this sequence. Starting point is a semiconductor substrate 500 comprising preprocessed portions such as well implantations and further doped regions. Several trenches such as the first trench 510, the second trench 515, the second gate trench 520 and the second field plate trench 530 may be formed in the surface of the semiconductor substrate. FIG. 5A shows a plan view of the semiconductor substrate. FIG. 5A shows different trenches. As is to be clearly understood, a plurality of trenches of the same kind may be present in the single semiconductor substrate. FIG. 5A shows views of several trenches for explaining the principles of forming the insulating layer having a locally varying thickness. For example, the second trench 515 may have a smaller width than the first width 510.

FIG. 5B shows a cross-sectional view of the semiconductor substrate taken in a plane parallel to the main surface of the semiconductor substrate, after performing a process of growing or depositing a first dielectric layer 540. For example, the first dielectric layer 540 may comprise silicon oxide, silicon nitride or any other suitable dielectric material. The layer 540 may be formed by generally known deposition methods such as thermal oxidation or a CVD method.

Thereafter, a photoresist layer 545 is formed and a photolithographic process is performed so as to generate a photomask. FIG. 5C shows a cross-sectional view of an example of a resulting structure.

Then, an anisotropic etching step may be performed so as to remove the dielectric layer from the portions of the semiconductor substrate that are not covered with the photoresist layer 545. FIG. 5D shows an example of a resulting structure.

Figure 5F:
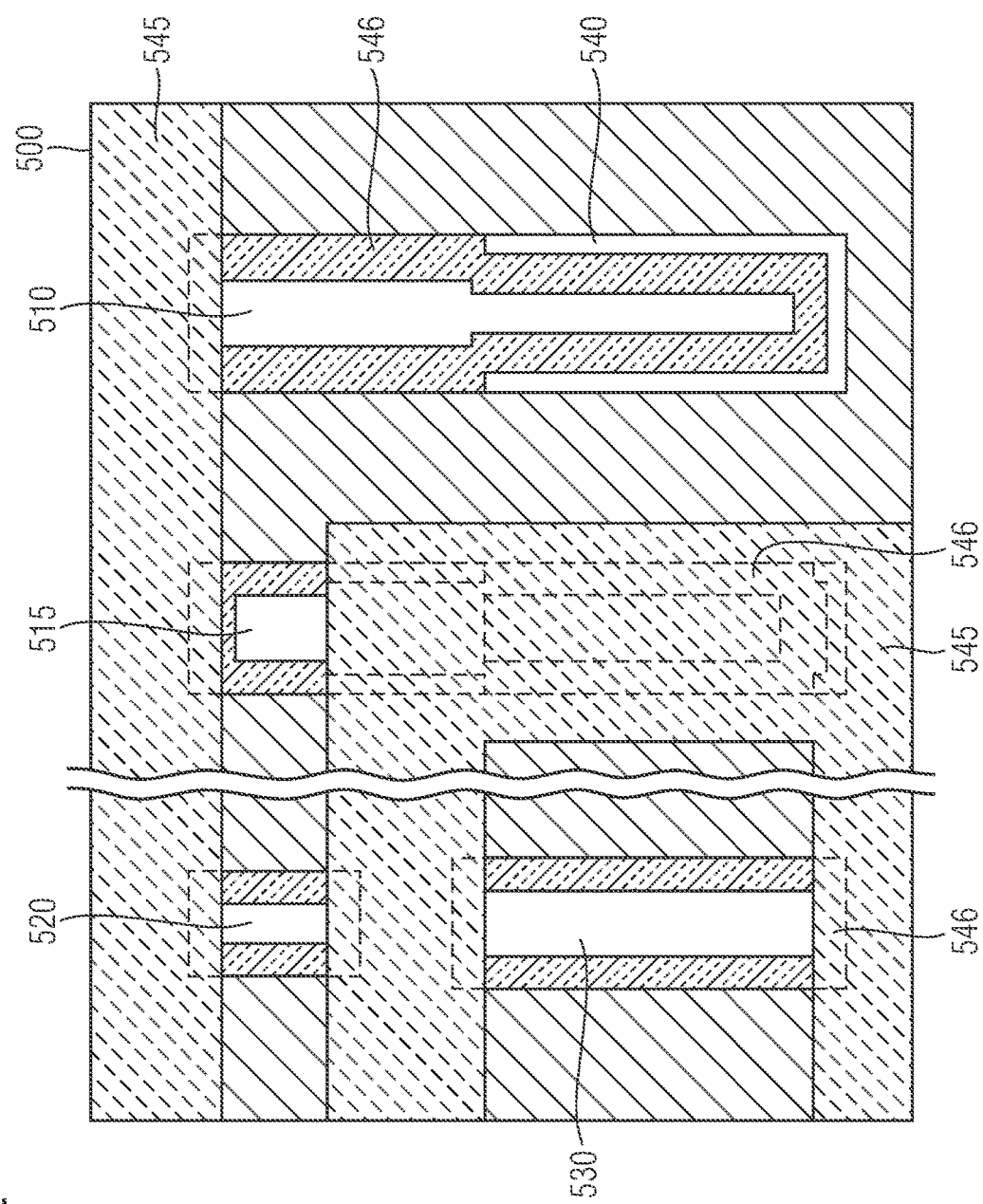

Thereafter, a second dielectric layer 546 is formed. For example, the second dielectric layer may be formed by deposition or by thermal oxidation. According to an embodiment, the second dielectric layer 546 may comprise a material that may be etched selectively with respect to the first dielectric layer. As is shown in FIG. 5E, the second dielectric layer 546 may be formed so as to be adjacent to the semiconductor substrate material 500 or so as to be adjacent to the first dielectric layer 540. The second dielectric layer 546 may be deposited or grown to a thickness so that the second trench 515 is completely filled at a portion between two portions of the first dielectric layer 540. Thereafter, a photoresist layer 545 may be formed over the semiconductor substrate and may be patterned so as to form an etching mask. FIG. 5F shows a cross-sectional view of a resulting structure.

Figure 5G:
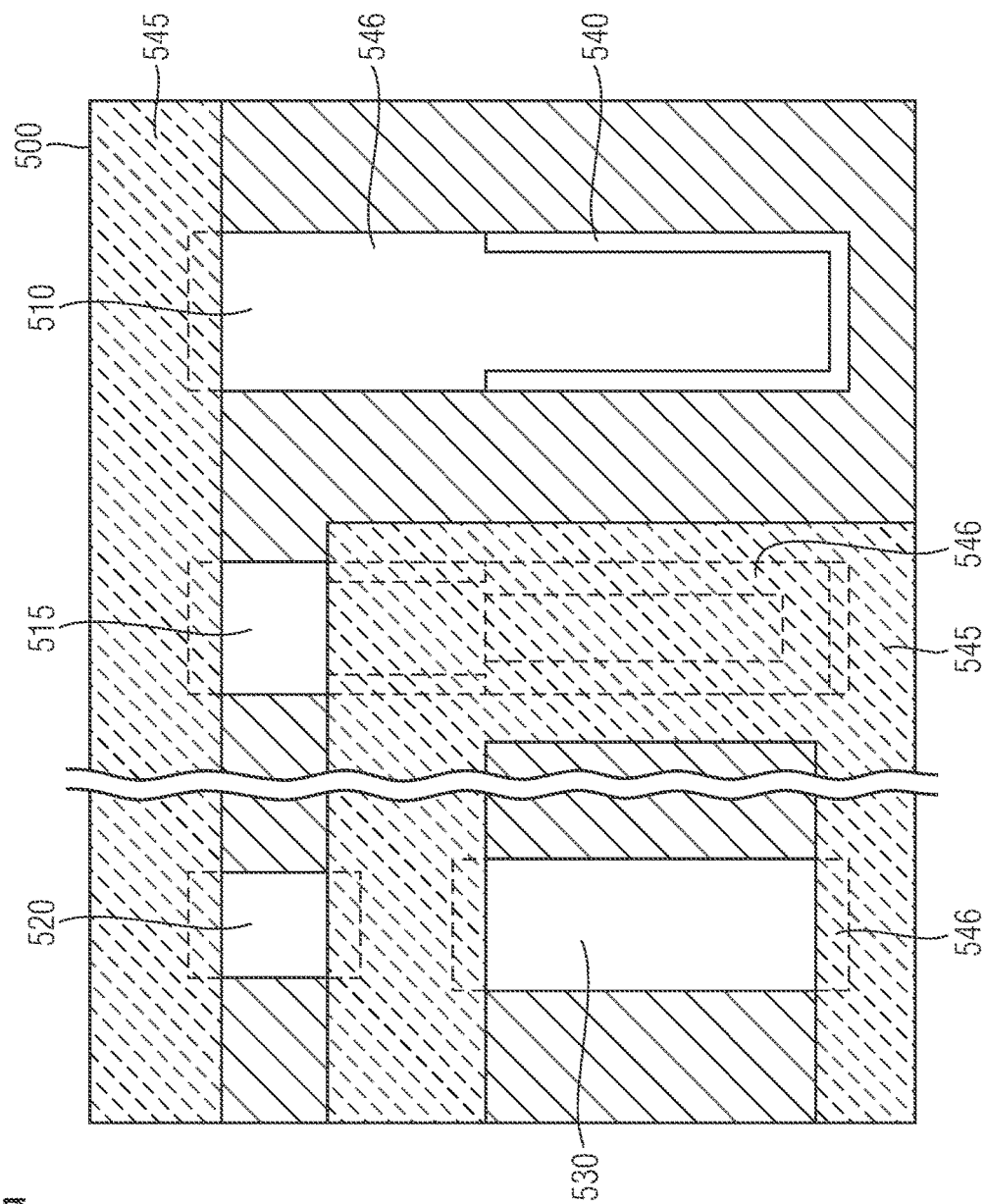

Then, an anisotropic etching step may be performed so as to remove the uncovered portions of the second dielectric layer 546. As a consequence, the portions of the first dielectric layer 540 remain in the first trench 510 after this etching step. FIG. 5G shows a cross-sectional view of a resulting structure.

Thereafter, a third dielectric layer 547 may be formed over the resulting substrate. For example, the third dielectric layer 547 may comprise the same material or a material different from the first or the second dielectric layer. For example, the material of the third dielectric layer may be identical with the material of the second dielectric layer.

Figure 5H:
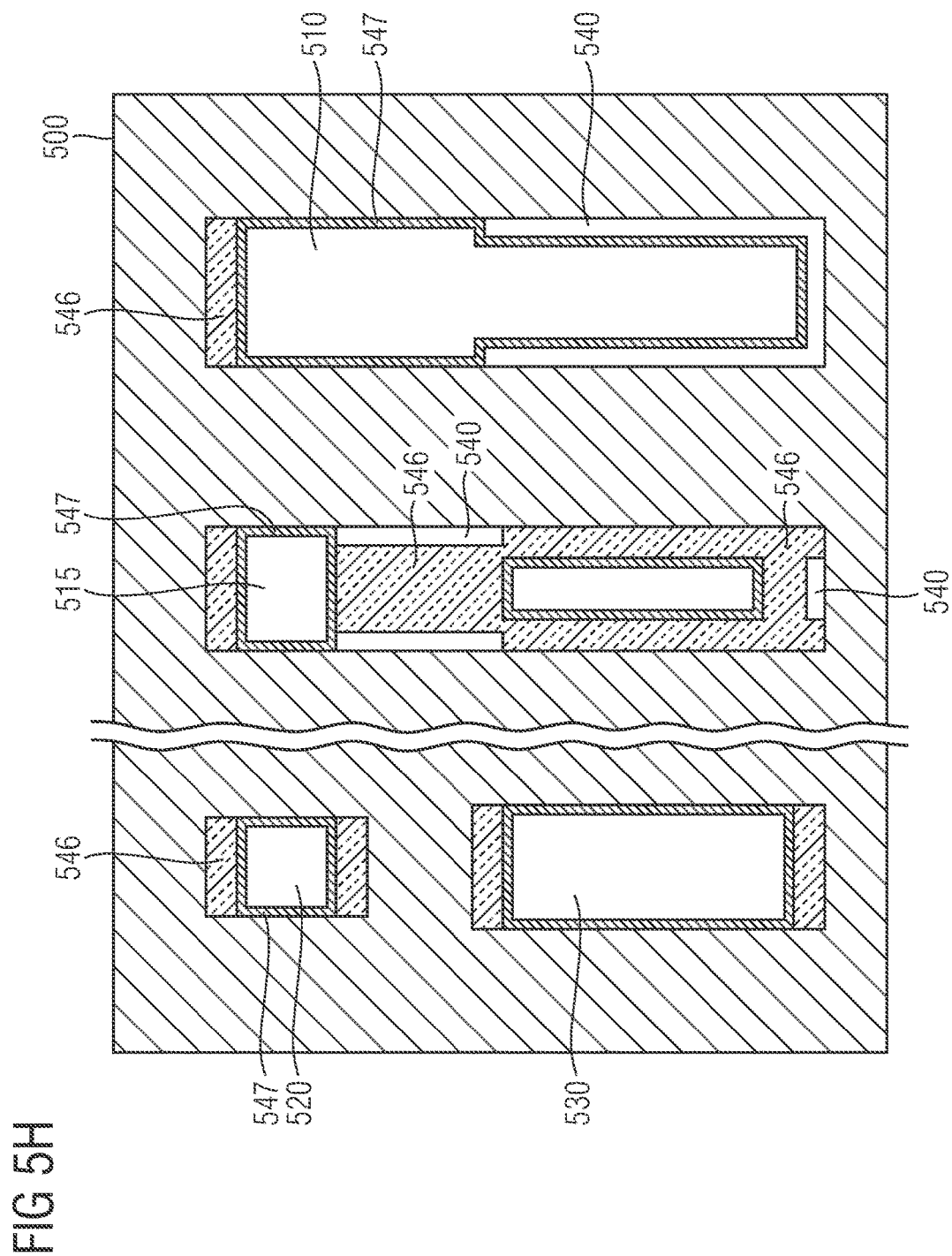
Figure 51:
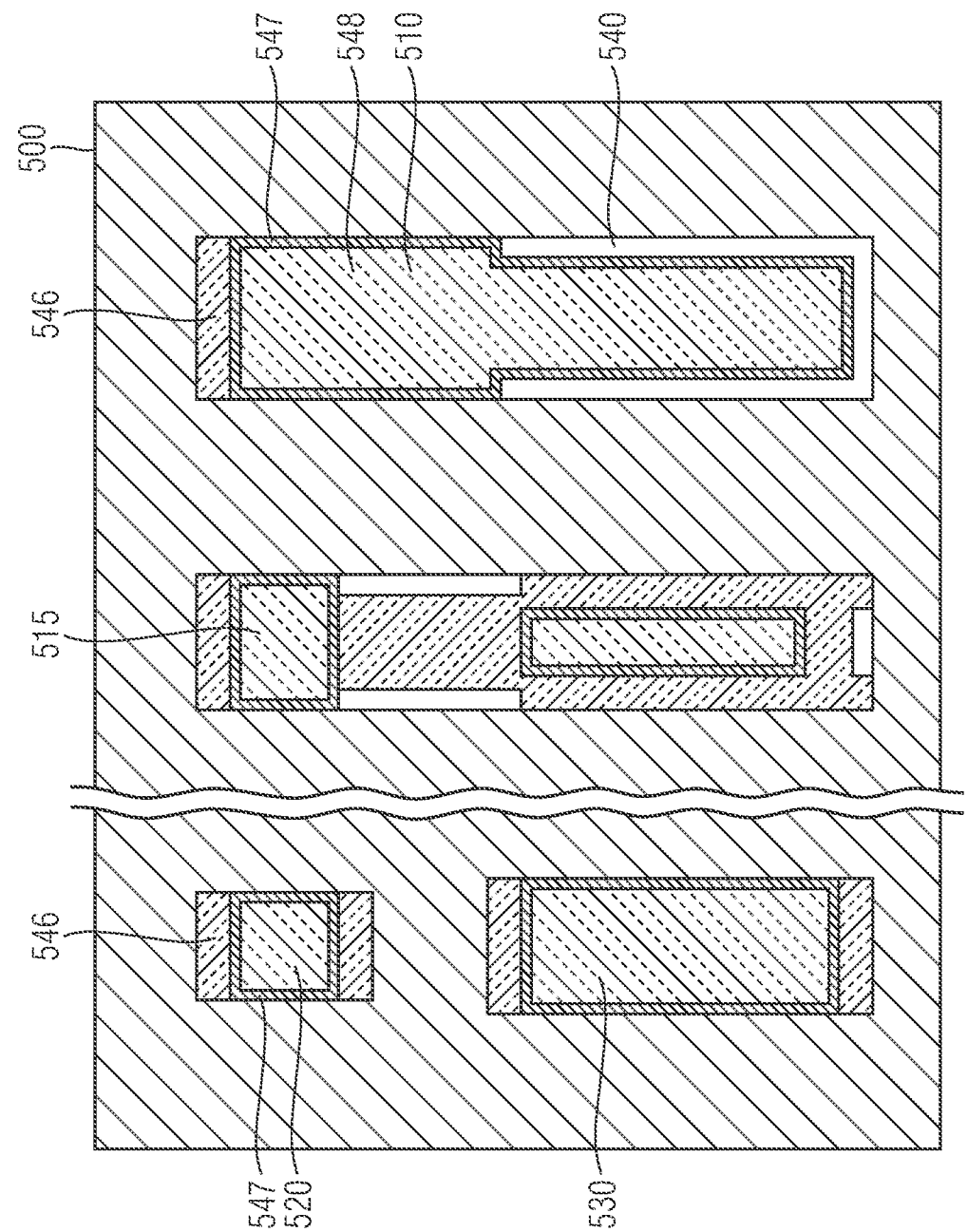

FIG. 5H shows an example of a resulting structure. Thereafter, a conductive material such as polysilicon or a metal may be filled in the several trenches formed in the semiconductor substrate 500.

FIG. 5I shows a cross-sectional view of a resulting structure. As is shown, the conductive material 548 is insulated from the adjacent semiconductor substrate 500 by a layer stack of insulating layers 540, 546, 547. Accordingly, the layer thickness of an insulating material between the conductive layer 548 and the semiconductor substrate 500 has a thickness that varies in dependence from the position of the insulating material.

For example, the first trench 510 may correspond to the gate trench that is connected with a field plate trench. The field dielectric layer comprises the first dielectric layer 540 and the third dielectric layer 547 which has a larger thickness than the third dielectric layer 547 alone. The gate dielectric layer that is disposed between the gate electrode and the channel region comprises the third dielectric layer 547 only. The gate dielectric layer that is disposed between the gate electrode and the source region comprises the second dielectric layer 546 and the third dielectric layer 547.

The second trench 515 comprises the conductive layer 548 in different trench portions that are insulated from each other. The thickness of the dielectric layer that is disposed between the conductive layer 548 and the adjacent substrate material differs depending on the position. In the second gate trench 520, the gate dielectric layer adjacent to the channel region comprises the third dielectric layer 547, whereas the gate dielectric layer adjacent to the source region or adjacent to the drain region comprises the second dielectric layer and the third dielectric layer. Likewise, the field dielectric layer has a varying thickness depending on the position of the field dielectric layer. By forming the second dielectric layer 546 in a thickness so that a portion of the second trench is filled with the second dielectric layer 546, the gate electrode and the field plate are insulated from each other.

Figure 6:
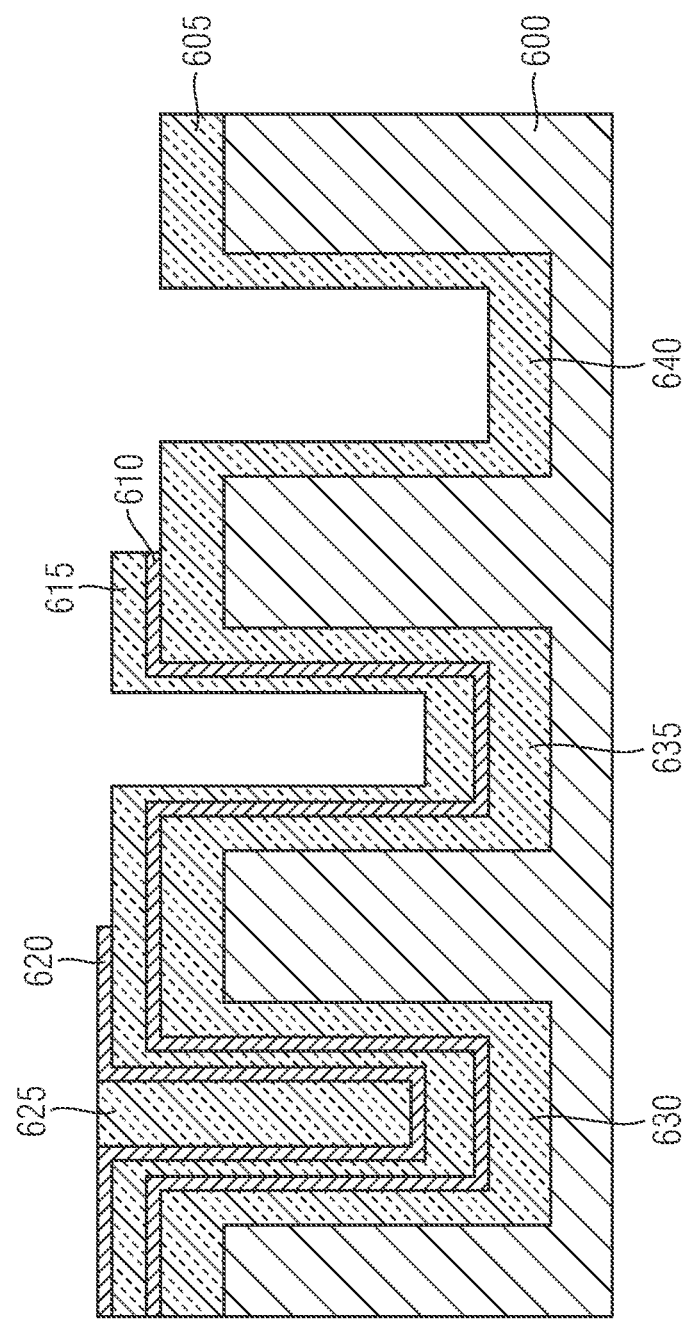
FIG. 6 shows a cross-sectional view of a substrate illustrating a further method of manufacturing an integrated circuit.

FIG. 6 illustrates a cross-sectional view of a semiconductor substrate 600 comprising a first trench 630, a second trench 635 and a third trench 640. A layer stack comprising a first dielectric layer 605, a second dielectric layer 615 and a third dielectric layer 625 is formed over the semiconductor substrate 600. A first etch stop layer 610 is disposed between the first dielectric layer 605 and the second dielectric layer 615. A second etch stop layer 620 is disposed between the second dielectric layer 615 and the third dielectric layer 625. Using different photo masks for patterning a photoresist material, etching steps may be performed so as to etch a dielectric layer to the next etch stop layer. By employing appropriate photo masks, areas with different oxide thicknesses may be defined. This embodiment implements a method, according to which first, a layer stack including the first, the second and the third dielectric layers, separated by etch stop layers, respectively, are deposited over the semiconductor substrate 600. Thereafter, several photomasks are generated and appropriate etching processes are performed.

Figure 7:
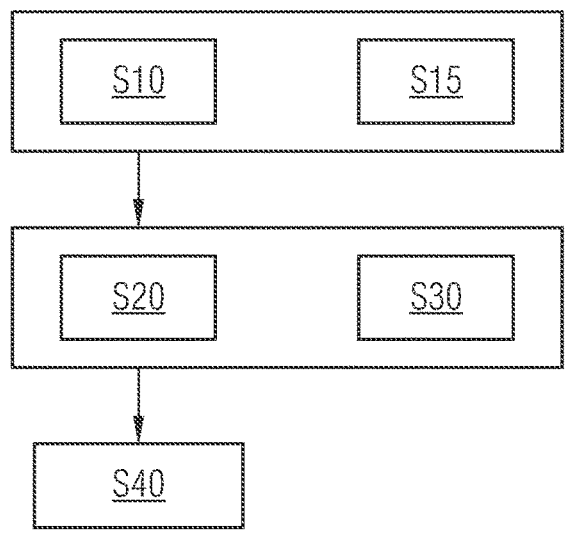
FIG. 7 shows a flow diagram showing elements of a method of manufacturing an integrated circuit according to an embodiment.

FIG. 7 illustrates a method of manufacturing an integrated circuit including forming a transistor in a semiconductor substrate. As is illustrated, forming the transistor comprises forming a source region (S40), forming a drain region (S40), forming a channel region (S10), forming a drift zone (S15), forming a gate electrode (S20) adjacent to the channel region, and forming a gate dielectric (S30) adjacent to the gate electrode, the gate electrode extending in a first direction parallel to the main surface, the gate electrode being disposed adjacent to at least two sides of the channel region, the channel region and the drift zone being disposed along the first direction between the source region and the drain region. The gate dielectric is formed so as to have a thickness that varies at different positions of the gate electrode.

Figure 8:
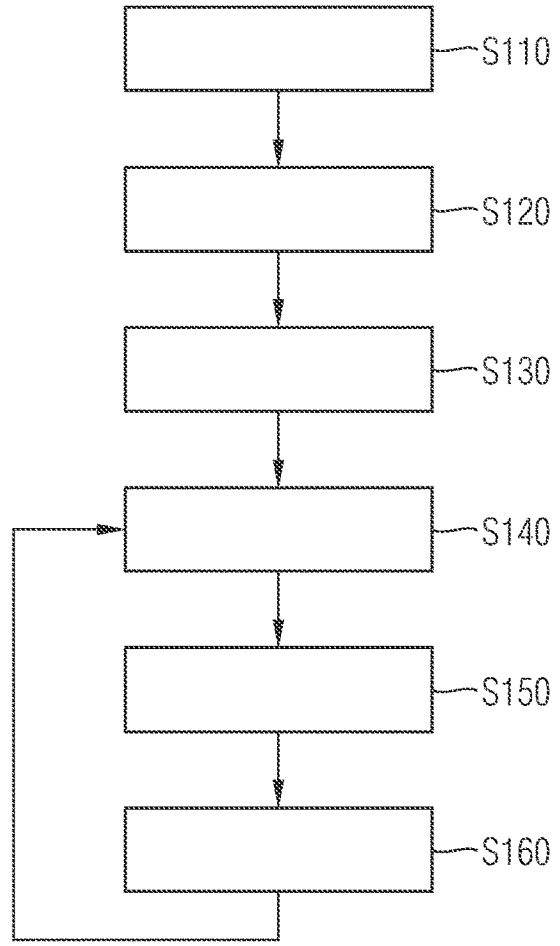
FIG. 8 shows a flow diagram of a method according to a further embodiment.

FIG. 8 further illustrates the method of manufacturing an integrated circuit including forming a patterned dielectric material according to the embodiment that has been explained above with reference to FIGS. 5A to 5I. The method comprises forming a first dielectric layer (S110) over a carrier, generating a first photomask (S120), etching the first dielectric layer (S130), forming a further dielectric layer (S140), patterning a further photomask (S150), etching the further dielectric layer (S160). Depending on the patterned dielectric material to be formed, the processes S140, S150, S160 may be repeated. According to an embodiment, the layers may be formed over a semiconductor substrate including trenches that are etched in the main surface of the semiconductor substrate. The width of the trenches and the thickness of the dielectric layers may be adjusted so that the dielectric layer may fill a trench or may a conformal layer.

FIG. 9 further illustrates the method of manufacturing an integrated circuit including forming a patterned dielectric material according to the embodiment that has been illustrated above with reference to FIG. 6. The method comprises forming a dielectric layer over a carrier (S210), forming a first etch stop layer over the dielectric layer (S220), forming a further dielectric layer (S240), and forming a further etch stop layer (S250). The processes S240 and S250 may be repeated so that a dielectric layer forms the topmost layer. The method further comprises generating a photomask (S260) and etching to the topmost etch stop layer (S270). The processes S260 and S270 may be repeated to form a desired patterned dielectric material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising a transistor in a semiconductor substrate having a main surface, the transistor comprising:
a source region;
a drain region laterally spaced apart from the source region;
a channel region and a drift zone each being laterally disposed between the source and drain regions;
a gate trench formed in the main surface of the semiconductor substrate;
an electrically conductive gate electrode formed in the gate trench;
a gate dielectric formed in the gate trench and electrically insulating the gate electrode from the semiconductor substrate,
wherein the gate trench comprises: first, second, third and fourth sidewalls and a bottom surface, the first sidewall extending though and facing the source region, the second sidewall extending through and facing the drift zone, and third and fourth sidewalls each extending through and facing the channel region and each extending from the first sidewall to the second sidewall,
wherein the second sidewall is laterally spaced apart from the drain region by a portion of the drift zone, and
wherein a first thickness of the gate dielectric as measured between the gate electrode and the second sidewall is greater than a second thickness of the gate dielectric as measured between the gate electrode and the first sidewall.

2. The semiconductor device of claim 1, wherein the gate electrode comprises a first end that faces the first sidewall, a second end that faces the second sidewall, and wherein the gate electrode is elongated in a length direction that extends between the first and second ends.

3. The semiconductor device of claim 2, wherein the gate electrode comprises third and fourth side faces that are parallel to one another and each extend from the first end to the second end, wherein a thickness of the gate electrode as measured between the third and fourth side faces is substantially uniform throughout a length of the gate electrode, the length of the gate electrode being measured between the first and second ends.

4. The semiconductor device of claim 1, wherein a thickness of the gate dielectric as measured between the gate electrode and the third sidewall is substantially identical to the second thickness.

5. The semiconductor device of claim 1, wherein the gate electrode has an asymmetric geometry from a plan-view perspective.

6. The semiconductor device of claim 5, wherein the gate electrode comprises a first end that faces the first sidewall, a second end that faces the second sidewall, and third and fourth side faces that are parallel to one another and each extend from the first end to the second end, and wherein from the plan-view perspective the first end is completely curved from the third face to the fourth face and the second end is completely linear from the third face to the fourth face.

7. The semiconductor device of claim 6, wherein a portion of the gate dielectric between the first sidewall of the gate trench and the first end of the gate electrode is C-shaped and has the second thickness throughout the C-shape.

8. A semiconductor device comprising a transistor in a semiconductor substrate having a main surface, the transistor comprising:
a source region;
a drain region laterally spaced apart from the source region;
a channel region and a drift zone each being laterally disposed between the source and drain regions;
a plurality of gate trenches formed in the main surface of the semiconductor substrate,
an electrically conductive electrode formed in each of the gate trenches,
a gate dielectric formed in each of the gate trenches, the gate dielectric electrically insulating each gate electrode from the semiconductor substrate;
a plurality of field plate trenches formed in the main surface of the semiconductor substrate;

an electrically conductive field plate formed in each of the field plate trenches;

a gate dielectric formed in each of the gate trenches, the gate dielectric electrically insulating each field plate from the semiconductor substrate, wherein each of the gate trenches extend in a first lateral direction from the source region through the channel region to reach the drift zone, wherein each of the field plate trenches are disposed within the drift zone and laterally separated from each of the gate trenches in the first lateral direction, wherein a pitch of the gate trenches is smaller than a pitch of the field plate trenches, the pitch of the gate trenches and field plate trenches being measured in a second lateral direction of the semiconductor device, the second lateral direction being perpendicular to the first lateral direction and parallel to the main surface.

9. The semiconductor device of claim 8, wherein each gate trench comprises:

first, second, third and fourth sidewalls and a bottom surface, the first sidewall extending though and facing the source region, the second sidewall extending through the drift zone and facing the drain region, and third and fourth sidewalls each extending through and facing the channel region and each extending from the first sidewall to the second sidewall, and wherein, for at least one of the gate trenches:

a first thickness of the gate dielectric as measured between the gate electrode and any one of the first sidewall, the second sidewall, the third sidewall, the fourth sidewall, or the bottom surface is different from a second thickness of the gate dielectric as measured between the gate dielectric and any different one of the first sidewall, the second sidewall, the third sidewall, the fourth sidewall, or the bottom surface.

10. The semiconductor device of claim 9, wherein the first thickness is measured between the gate electrode and the second sidewall, and wherein the second thickness is measured between the gate electrode and any one of: the first sidewall, the third sidewall, or the fourth sidewall.

* * * * *